United States Patent [19]
Szumowski et al.

[11] Patent Number: 6,137,291
[45] Date of Patent: Oct. 24, 2000

[54] TELESCOPING COIL ARRAY FOR MAGNETIC RESONANCE IMAGING OF EXTREMITIES

[75] Inventors: Jerzy Szumowski; Kryss Kojima, both of Portland, Oreg.

[73] Assignee: Oregon Health Sciences University, Portland, Oreg.

[21] Appl. No.: 08/914,483

[22] Filed: Aug. 19, 1997

Related U.S. Application Data

[60] Provisional application No. 60/024,138, Aug. 19, 1996.

[51] Int. Cl.[7] .................................................. G01V 3/00
[52] U.S. Cl. ........................................ 324/318; 600/422
[58] Field of Search ................................. 324/318, 319, 324/320, 322, 300, 307, 309; 600/422, 423

[56] References Cited

U.S. PATENT DOCUMENTS

| | | |
|---|---|---|
| 4,721,913 | 1/1988 | Hyde et al. . |
| 4,825,162 | 4/1989 | Roemer et al. . |

(List continued on next page.)

OTHER PUBLICATIONS

Alley et al., Development of a Phased–Array Coil for the Lower Extremities, MRM 34:260–267, 1995.

Szumowski et al., A Telescopic Phased Array Coil for MRA of the Lower Extremities, Proc. of the Society of Magnetic Resonance, Nice, France, Aug. 19–25, 1995, vol. 2., one page.

Monroe et al., Phased Array Coils for Upper Extremity MRA, MRM 33:224–229, 1995.

Yuan et al., Magnetic Resonance Imaging to Study Lesions of Atherosclerosis in the Hyperlipidemic Rabbit Aorta, Magnetic Resonance Imaging , vol. 14, No. 1, pp. 93–102, 1996.

Schiebler et al., Magnetic Resonance Arteriography of the Pelvis and Lower Extremities, Magnetic Resonance Quarterly, vol. 9, No. 3, pp. 152–187, 1993.

Boskamp, Improved Surface Coil Imaging in MR: Decoupling of the Excitation and Receiver Coils, Radiology 1985; 157:449–452.

Boskamp, A New Revolution in Surface Coil Technology: the Array Surface Coil, Philips Medical Systems, Best, The Netherlands, p. 405.

Edelman, Angiograpy: Present and Future, AJR 1993, 161:1–11.

Kneeland et al., High–Resolution MR Imaging with Local Coils, RSNA, 1989, pp. 1–7.

Kulkarni et al., Technical Considerations for the Use of Surface Coils in MRI, AJR 147:373–378, Aug. 1986.

Rajan et al., An Extended–Length Coil Design for Peripheral MR Angiography, Magnetic Resonance Imaging , vol. 9, pp. 493–495, 1991.

Ginsberg et al., Optimum Geometry of Saddle Shaped Coils for Generating a Uniform Magnetic Field, The Review of Scientific Instruments, vol. 14, No. 1, Jan. 1970., pp. 122–123.

*Primary Examiner*—Louis Arana
*Attorney, Agent, or Firm*—Klarquist Sparkman Campbell Leigh & Whinston, LLP

[57] ABSTRACT

An MR coil array includes a plurality of telescopically arranged coil units, spanning the length of an extremity (e.g. a leg). The coil in each unit encircles the extremity, providing good SNR from all sides and for deep structures as well. The tapered shape of the array conforms generally to the patient anatomy, minimizing sensing distances, further enhancing SNR. A low ratio between the volume imaged and the aggregate coil conductor length further contributes to high SNR. A multiplicity of tuning capacitors makes the array relatively insensitive to detuning by differently-sized patients. Adjoining coils can be oriented to produce perpendicular magnetic fields, reducing coupling therebetween. An apparatus employing two such coil arrays allows imaging of two extremities at once.

7 Claims, 3 Drawing Sheets

U.S. PATENT DOCUMENTS

| | | | |
|---|---|---|---|
| 4,985,678 | 1/1991 | Gangarosa et al. . | |
| 5,049,821 | 9/1991 | Duensing et al. | 324/322 |
| 5,252,922 | 10/1993 | Larson, III . | |
| 5,277,183 | 1/1994 | Vij | 324/318 |
| 5,361,764 | 11/1994 | Reynolds et al. | 324/318 |
| 5,394,087 | 2/1995 | Molyneaux . | |
| 5,399,970 | 3/1995 | Pelc et al. . | |
| 5,500,596 | 3/1996 | Grist et al. . | |
| 5,548,218 | 8/1996 | Lu . | |
| 5,578,925 | 11/1996 | Molyneaux et al. . | |
| 5,594,337 | 1/1997 | Boskamp | 324/318 |

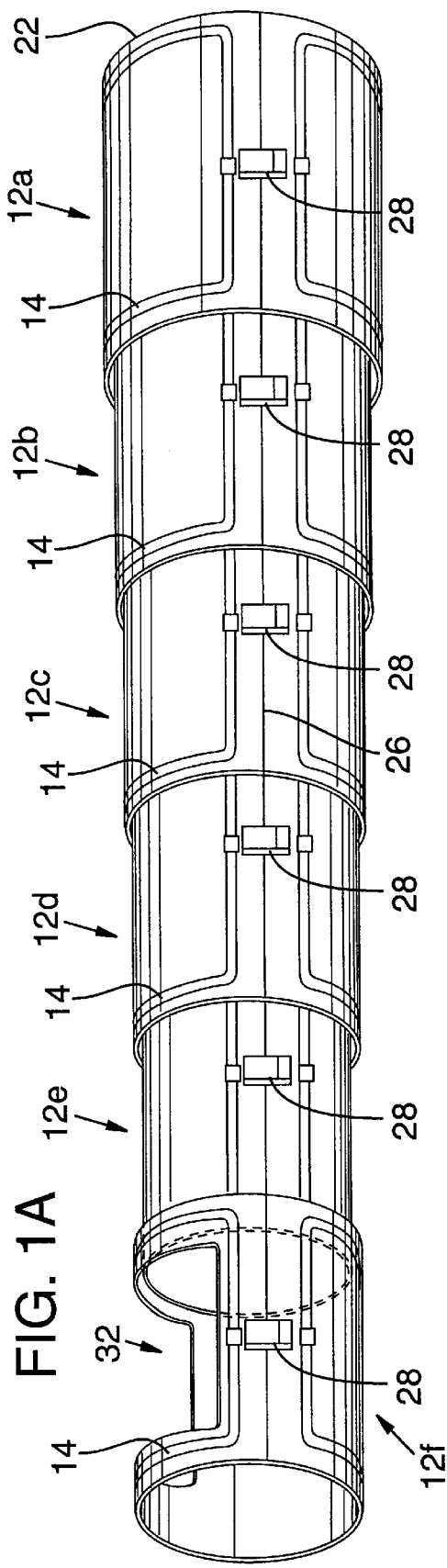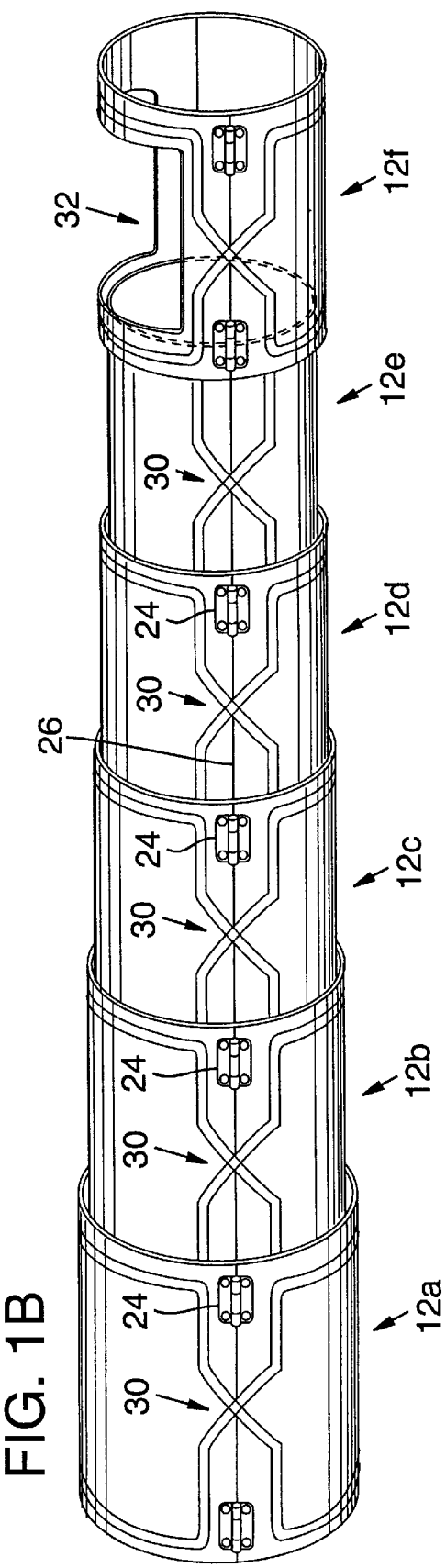

TELESCOPING COIL ARRAY FOR MAGNETIC RESONANCE IMAGING OF EXTREMITIES

RELATED APPLICATION

This application claims priority from our now abandoned provisional application Ser. No. 601,024,138, filed Aug. 19, 1996.

FIELD OF THE INVENTION

The present invention relates to magnetic resonance imaging, and more particularly relates to coil arrangements for enhancing the imaging of patient extremities.

BACKGROUND AND SUMMARY OF THE INVENTION

Magnetic resonance (MR) imaging is a preferred form of medical imaging for several reasons, among them the high resolution of the resulting imagery (independent of wavelength), and its lack of side effects.

Over the past decade, considerable effort has been spent, and considerable progress has been made, in this field. However, existing MR techniques are still poorly suited for certain imaging tasks. One of these is in angiography of the extremities.

MR angiography (MRA)—the imaging of the circulatory system—is difficult in the extremities for a variety of reasons. One is that the subjects being imaged—veins and arteries—become progressively smaller at locations remote from the heart. Small features are difficult to discern in existing MR angiography techniques because signals corresponding thereto are masked in the final image by noise signals. Little can be done about noise per se; where improvement is possible is in increasing the desired signals so that noise's masking effect is reduced. The figure of merit by which this aspect of an MR imaging system's performance is measured is "signal to noise ratio," or SNR.

Another difficulty with any MR imaging of the extremities—especially the legs—is their size. To complete a MR examination of a patient's leg, the leg must be imaged at a variety of different locations, necessitating repeated repositioning of the patient. A typical examination requires three to six different patient positions. Such repositioning prolongs the examination, with attendant increase in cost and patient inconvenience.

The original technique for MR angiography of the extremities, and the technique still most popular for imaging of the thigh, is use of a whole-body receiving coil. Disadvantages of this method include the time spent repositioning the patient for each station, limited SNR, and limited spatial resolution.

Various attempts have been made to address the foregoing limitations of the body coil. None, however, has proved wholly satisfactory.

One attempt to address such shortcomings is shown in U.S. Pat. No. 5,548,218 to Lu. In this system, three identical loop coils are positioned around a patient—one around the pelvic region; one around the thighs, and one around the calves. These coils are driven in phase quadrature with associated planar coils, yielding some small improvement in SNR. However, the overall performance is disappointing.

Applicants believe the poor performance of Lu's system is due to its use of large, widely spaced coils to image from the pelvis to the feet. The weak signal emitted by precessing atoms—the phenomenon on which MR relies—diminishes with the cube of distance. So a change in distance from 2 cm. to 4 cm. (between the sensing coil and the precessing source) results in an eight-fold reduction in the signal strength received—nearly 10 dB. (This relationship does not hold for distances very near the sensing coil.) The large distances over which Lu's coils receive signals thus grossly impairs the SNR of the resulting imagery. Further, the large size of Lu's coils increases their noise pick-up, without a commensurate increase in their pick-up of desired MR signals (i.e. coil segments remote from a desired imaging site contribute little to the MR imagery of that site). Finally, the planar coils Lu employs to achieve quadrature operation suffer from the SNR drawbacks of all planar coils.

Another approach to MR imaging of the extremities is shown in U.S. Pat. No. 5,500,596 to Grist et al (also described in Alley et al, "Development of a Phased-Array Coil for the Lower Extremities," Magn. Reson. Med. 34:260–267 (1995)). Four coils are used in this arrangement: two horizontal and two vertical, forming an "I-beam" construction. The two horizontal coils span the length and width of both legs—one positioned above the legs and one positioned below. The vertical coils are both disposed between the patient's legs. This orthogonal coil arrangement was apparently adopted to reduce the effects of mutual inductance between the coils. In another embodiment, each horizontal coil is replaced with two coils, yielding a total of six coils.

Again, the Grist et al system suffers in SNR performance. Its use of four (or six) coils provides somewhat better performance than Lu. However, because the coils are planar, and because they span only three of the four sides of a patient's leg, substantial portions of the leg are still quite remote from any coil, impairing overall SNR. And, like Lu, each coil is large and spans a large area, again degrading SNR.

In "Magnetic Resonance Arteriography of the Pelvis and Lower Extremities," Magn. Reson. Quarterly, 9(3):152–187 (1993), Schiebler et al employed three overlapping coils on a cylindrical plastic form to image portions of a patient's leg. Adjacent coils were rotated 90 degrees from one another to minimize mutual coupling. Schiebler's arrangement, however, is unable to image an entire leg without repositioning because the coils span only 58 cm. Moreover, Schiebler's SNR suffers due to larger than necessary spacing between the coil and the leg.

In "Phased Array Coils for Upper Extremity MRA," Magn. Reson. Med. 33:224–229 (1995), Monroe et al compared three coil arrangements for MR angiography of the arm. One arrangement comprised three overlapping coils mounted along four inch PVC piping. A second comprised three overlapping coils mounted on acrylic plastic that was slightly curved by heating. The third comprised three overlapping coils mounted on a flat piece of acrylic. Monroe concluded that the latter arrangement was preferable. He criticized the first as not fitting all patients, and criticized the first two as providing only a 10–20% improvement in SNR over the third—an improvement he regarded as minimal.

What Monroe apparently compared, however, was the best SNR of each configuration. SNR, however, is a function of location. The best SNR is obtained at points relatively close to the receiving coil, i.e. close to the skin. At deeper locations, the SNR is necessarily worse. In many applications of MR imaging, applicants believe the important metric is not how good is the best part of the imagery, but how good is the worst.

Each of the foregoing approaches employs multiple coils. The use of multiple coils, more generally, is discussed in Roemer et al, "The NMR Phased Array," Magn. Reson. Med. 16:192–225 (1990) and Hayes, "Volume Imaging with MR Phased Arrays," Magn. Reson. Med. 18:309–319 (1991).

An important application of MR angiography of the extremities is in identification of distal run-off vessels in the leg and the foot. (See, e.g., Owen et al, "Magnetic Resonance Imaging of Angiographically Occult Runoff Vessels in Peripheral Arterial Occlusive Disease," N. Engl. J. Med. 326:1577–1581 (1992); Carpenter et al, "Magnetic Resonance Angiography of Peripheral Runoff Vessels," J. Vasc. Surg. 16(6):807–13 (1992); McCauley et al, "Peripheral Vascular Occlusive Disease: Accuracy and Reliability of Time-of-Flight MR Angiography," Radiology, 192:351–357 (1992); and Owen et al, "Symptomatic Peripheral Vascular Disease," Radiology, 187(3):627–35 (1993)). None of the earlier-described coil arrangements is satisfactory for this application. The techniques that have met with the most success have used a small transmit-receive linear extremity coil. Such a coil provides high SNR, but overlap of adjacent imaging segments is required because of signal loss at its boundaries. Depending on the patient's size and precision of coil positioning, three to five stations are required to image from the foot to the knee.

Accordingly, there remains a need for coil arrangements that allow faster MR angiography of the extremities, with better spatial coverage, and with improved SNR.

In accordance with a preferred embodiment of the present invention, the foregoing and other disadvantages of existing MR coils for the extremities are overcome. In the illustrated embodiment, an MR receive coil array includes six telescopically arranged coil units, spanning the length of the extremity from the inguinal ligament to the foot. The coil in each unit encircles the extremity, providing good SNR from all sides and for deep structures as well. The tapered shape of the array conforms generally to the patient anatomy, minimizing the sensing distances, further enhancing SNR. A low ratio between the volume imaged and the aggregate coil conductor length further contributes to high SNR. A multiplicity of tuning capacitors makes the array relatively insensitive to detuning by differently-sized patients.

The foregoing and additional features and advantages of the present invention will be more readily apparent from the following detailed description, which proceeds with reference to the accompanying drawings.

BRIEF DESCRIPTION OF THE DRAWINGS

FIGS. 1A and 1B are perspective views of a coil array according to one embodiment of the present invention.

DETAILED DESCRIPTION

To provide an enabling disclosure without unduly lengthening this specification, applicants incorporate by reference the disclosures of U.S. Pat. Nos. 5,578,925, 5,548,218, 5,500,596, 5,399,970, 5,394,087, 4,825,162 and 4,721,913.

Referring to FIGS. 1A and 1B, an illustrative embodiment 10 of the present invention includes 6 coil units 12a, 12b, 12c, 12d, 12e, and 12f, each adapted to provide a magnetic component of the RF field perpendicular to the imaging apparatus's external magnetic field. These units are coupled to an MR imaging system (e.g. the Sigma 4X by GE Medical Systems, Milwaukee, Wis.—a 1.5T superconducting imager) through a suitable six-coil adapter. One suitable adapter is that provided with the GE six-coil spinal array.

Figure 2:
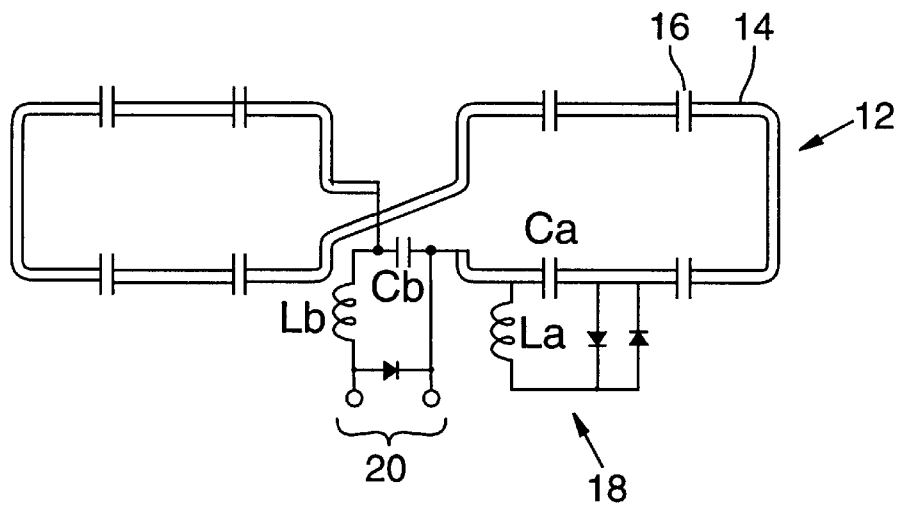
FIG. 2 is a schematic illustration of a single coil unit used in the FIG. 1 embodiment.

As shown in FIG. 2, each coil unit 12 includes a foil tape conductor 14, a plurality of tuning capacitors 16, a coupling/switching network 18, and a connection port 20. The foil tape conductor 14 and tuning capacitors 16 are all disposed on a plastic substrate 22 (FIG. 1); the other components are mounted on or adjacent thereto. (For clarity of illustration, the capacitors 16, network 18, connection port 20, and cabling connecting the apparatus through the connection port to the imaging system, are not shown in FIG. 1)

The foil tape conductor 14 comprises 1 cm. wide, 3-mil adhesive copper foil. The capacitors 16 are chip capacitors suitable for high frequency use in strong magnetic fields. Each coil is tuned to the desired frequency, here 63.9 MHz.

The configuration of each illustrated coil is sometimes termed a "saddle" or "butterfly" configuration. Other configurations can, of course, be used.

The coupling/switching network 18 assures a 50 ohm match at the connection port 20, and additionally provides for diode-switched detuning of the coil during transmit pulses. Network inductor La resonates with capacitor $C_a$, and inductor $L_b$ resonates with capacitor $C_b$.

In the illustrated embodiment, the plastic substrate 22 comprises several short lengths of plastic (PVC) pipe, with the coil unit components disposed on the outside thereof. The circular cross-sectional shape of this substrate is believed to contribute to homogeneity of the resulting system. However, coil substrates of other shapes can alternatively be used. Generally speaking, signal-to-noise ratio is improved by placing the coil closer to the imaged subject, so a substrate shape that more closely conforms to the shape of the subject being imaged is generally desirable.

The illustrated plastic pipe is cut (26) into symmetrical halves (along a plane passing through the axis of the pipe) to allow opening to position the patient's leg therein. Hinges 24 are provided along the cut on one side; an over-center plastic latch 28 is provided along the cut on the opposite side to secure same in a latched position. The "X" crossover 30 of the foil coil conductors is effected over the hinged cut (the foil tape is insulated—with a suitable RF insulator—in this region).

The substrates for the six coil units are generally of different radial sizes so that the units can be positioned relative to one another in telescoped fashion. The first (and largest) coil unit, 12a, is sized to receive a patient's upper thigh. The next coil unit, 12b, is somewhat smaller, and sized to receive a patient's lower thigh. This procession continues until the fifth coil, 12e, which is the smallest and is sized to receive the patient's leg near the ankle. The last coil, 12f, breaks this progression and is somewhat larger than coil 12e, so that it can receive the patient's foot.

The last coil, 12f, is different in another respect; it includes two openings 32 through which parts of the patient's foot can extend. One opening on the bottom of the substrate (not shown) allows the patient's heel to extend through. An opening on the top of the substrate permits extension of anterior portions of the foot. The looped conductor in this sixth coil unit 12f passes around both of these openings. (Similar openings can be provided in the fifth coil unit, 12e, to accommodate the foot of a shorter patient.)

All of the coil units are aligned about the same axis (i.e. the pipe substrates are all coaxial). The overall length of the illustrated coil array is 94 cm.

All of the coil units are desirably sized to closely surround the patient anatomy. In a preferred embodiment, the greatest distance between any part of the patient's leg and the coil substrate adjacent thereto is less than four centimeters, and preferably is less than two.

Table I details dimension of an illustrative six-coil system:

TABLE I

| Coil | Circumference (cm.) | Length (cm.) |
| --- | --- | --- |
| 12a | 66 | 21 |
| 12b | 58 | 19.5 |
| 12c | 50 | 17.2 |
| 12d | 44.8 | 16 |
| 12e | 40.1 | 16 |
| 12f | 42.1 | 18 |

The physical dimensions of each of the six coils, and the values of the associated tuning capacitors, are provided in FIGS. 3A–3F.

In the illustrated embodiment, each of the coil units overlaps (telescopically) with the coil unit(s) adjacent thereto. This arrangement allows for compensation of the mutual inductance between the coil units. In particular, it is understood that the resonant frequency of a tuned circuit—like that shown in FIG. 2—can be "pulled" by a mutual inductance effect produced by another inductor in the tuned circuit's near field. Depending on the position of the nearby inductor (i.e. coil), the resonant frequency of the tuned circuit can be increased or decreased. In the illustrated embodiment, the degree of overlap between adjoining coil units is empirically adjusted so that the resonant frequencies of the two coil units are neither increased nor decreased. One method for accomplishing this is to place a "phantom" in the apparatus (in lieu of a patient's leg) and monitor the resonant frequencies of two of the tuned circuits with a network analyzer as the overlap between the coil units is increased and decreased. The use of such phantoms is well understood in the art. Another, preferred, technique is to adjust the overlap while a patient's leg is in the apparatus. Generally, the overlap averages about 13% of the substrate length. This technique of decoupling coils is more particularly detailed in the Roemer paper, cited above.

In the illustrated form of the invention, all of the coil units are operated with their magnetic fields oriented vertically. However, in alternative embodiments, this need not be so. In one alternative embodiment, for example, the first and second coil units, 12a, 12b, are physically rotated 90 degrees relative to the third and succeeding coil units 12c–f, thereby producing horizontally-oriented fields. This arrangement is desirable, for example, when the illustrated apparatus is used in conjunction with a conventional pelvic coil, which produces a vertically-oriented magnetic field. Rotating the thigh coil units so their magnetic fields are orthogonal to the pelvic coil fields helps decouple these units, reducing crosstalk and improving performance.

In one embodiment of the invention, the foregoing principles are extended to an apparatus having coils spaced all the way from the abdomen to the feet. Such an arrangement permits all of this volume to be quickly imaged, without moving the patient. The 90 degree rotation of magnetic fields in adjoining segments of the coil array is particularly important in such a large array to minimize intercoupling difficulties.

In yet another form of the invention, each of the coil units comprises not just a single coil, but a pair of coils operated in phase quadrature, as is well understood in the art. Such an arrangement provides a small (square root of two), but sometimes important, improvement in signal-to-noise ratio. In such an arrangement, all of the units can be operated with similarly-oriented magnetic fields, or alternate relative field arrangements—like those discussed above—can be employed.

While the illustrated embodiments provide superior SNR performance, the readability of the resulting imagery can sometimes be improved further by use of an intravenous contrast agent, such as Gadolinium.

Imaging and Comparison Protocols

In the illustrated embodiment, the imaging protocol consisted of localizer images followed by MR angiography. The former were acquired with spin-echo sequences in the coronal plane, a repetition time of 400 msec., an echo time of 17 msec, a field of view of 48 cm., a slice thickness of 10 mm., a matrix size of 256×128, one signal average, and an acquisition time of 1:03. Three scans were used to image the entire leg.

When these tests were made, a six coil interface to the imager was not available, so a four coil interface was used instead. Since there were six coils but only four receivers, either the inferior four, middle four, or superior four coils were selected for each scan.

The MRA images were initially acquired with a two-dimensional time-of-flight pulse sequence in the axial plane, a repetition time of 33 msec., an echo time of 8 msec., a flip angle of 60 degrees, flow compensation, an inferior saturation pulse of 30 mm., a saturation gap of 5 mm., a field of view of 15 cm.×20 cm., a slice thickness of 1.8 mm., 100 slices, a 256×128 matrix, one signal average, and an acquisition time of 5:43.

In another protocol, the entire leg was imaged in three acquisitions. The thigh was imaged as one section, and the infrapopliteal region was divided into two sections. For the thigh, the slice thickness and field of view were increased to 4.0 mm. and 30 cm.×40 cm., respectively. For the infrapopliteal region, the field of view and slice thickness vary depending on the patient's size. The fields of view have varied from 15 cm.×20 cm. to 18cm.×24 cm., and the slice thicknesses have varied from 2.1 to 2.5 mm., with 2.3 mm. being the most common.

The two-dimensional time of flight axial images were reconstructed using a maximum intensity projection algorithm, then processed by interactive vascular imaging software provided with the scanner.

For comparison purposes, the MRA images were obtained using the illustrated telescopic array, a transmit/receive linear extremity coil (General Electric Medical Systems), and a quadrature body coil. The SNR and spatial homogeneity of the three coils were compared, based on the localizer and MRA images. Furthermore, SNR measurements were taken from axial two-dimensional time of flight images of a volunteer who underwent MRA exams using the telescopic coil and extremity/body coil combination. The average SNR of both methods were compared and statistical analyses were performed. In addition, the coils' SNR characteristics were compared by imaging a cylindrical phantom (10.2 cm. diameter by 100 cm. length) filled with 0.2 mmol $MnCl_2$ using a spin-echo sequence (400/12), a 256×128 matrix, a 10 mm. slice thickness with no skip, 16 cm. field of view, and one signal average.

For a comparison of the examination times required by the telescopic and extremity/body coil systems, a volunteer underwent consecutive peripheral MRA exams using each method. Both exams were performed by the same MR technologist. The exam times, comprised of patient positioning, pulse sequence prescriptions, scanner tuning, and scanning, were recorded by an observer.

Four patients were imaged with conventional angiography (CA) and femoral MRA using the illustrated apparatus. All four patients had ischemic tissue loss of the feet and three patients had insulin dependent diabetes. The conventional angiography was done with standard angiographic technique. A stepping table with "cut film" technique was used in all patients and the infrapopliteal vessels were also studied with supplemental digital subtraction views. In three patients, the ipsilateral superficial femoral artery was catheterized to improve visualization of the tibial vessels. The results of the CA were compared to the results of the femoral MRA. The femoral MRA and CA examinations were read by different radiologists that did not have the results of the other examinations.

Results

The localizer images in the coronal plane obtained with the telescopic phased array demonstrated good spatial homogeneity. For MRA in the knee, ankle, and foot, the telescopic array provided images that were comparable or better in image quality, SNR, and homogeneity, to that obtained with the manufacturer's extremity coil. In the thigh, the telescopic array produced MRA images that were significantly higher in SNR than that obtained with the body coil. Although some artifactual banding was present within the tissue on MIP reconstructed images, this did not compromise the SNR of arterial vessels.

Figure 4:
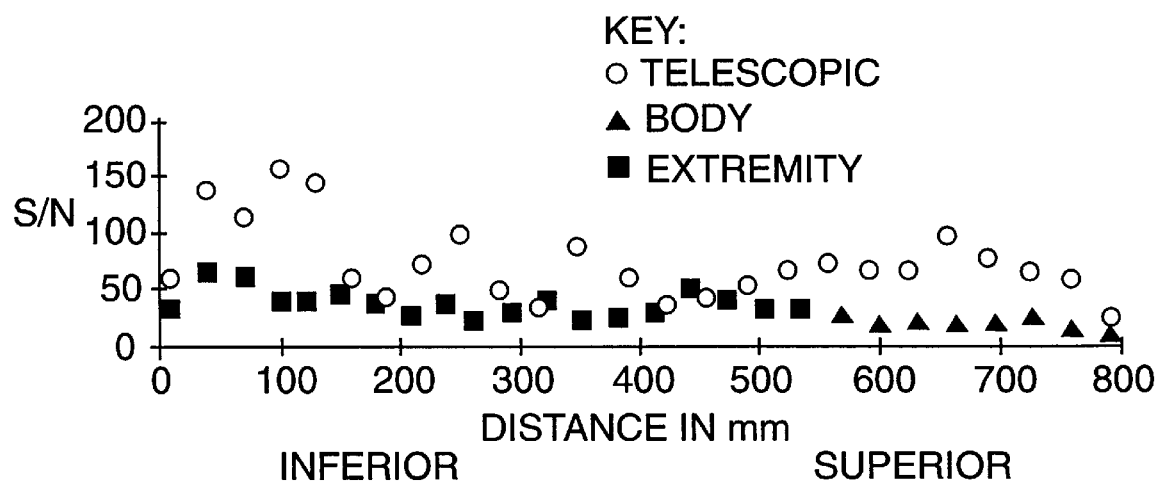
FIG. 4 compares the signal-to-noise ratio of the FIG. 1 embodiment with prior art techniques employing a body coil and an extremity coil.
Figure 3A:
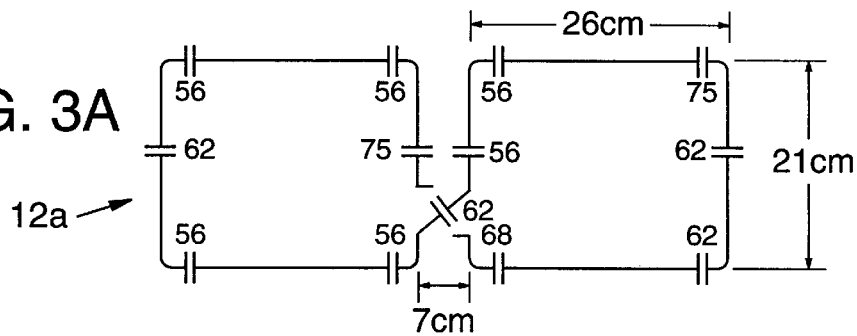
FIGS. 3A–3F further details the six coil units used in the FIG. 1 embodiment.
Figure 3B:
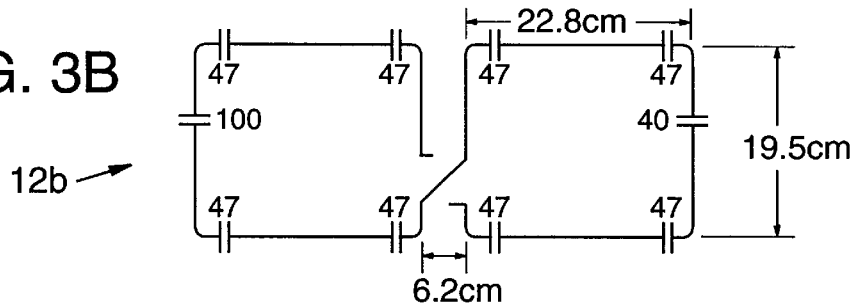
Figure 3C:
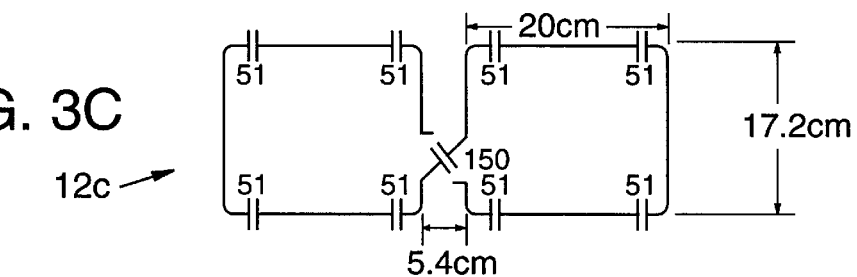
Figure 3D:
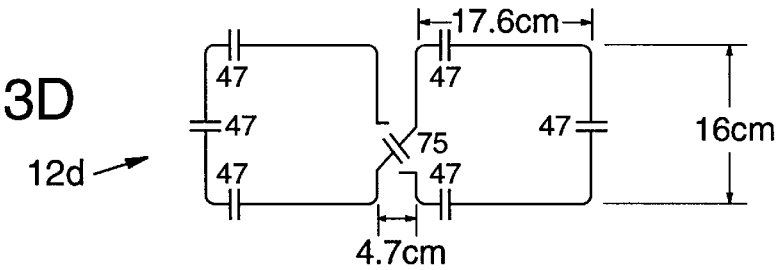
Figure 3E:
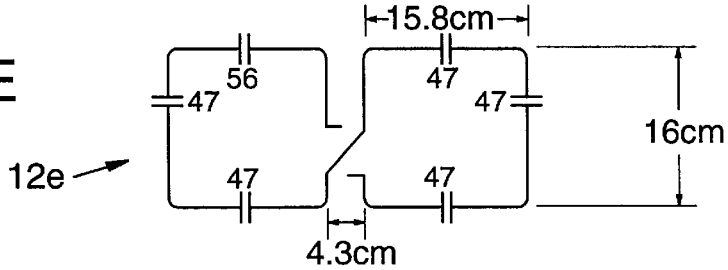
Figure 3F:
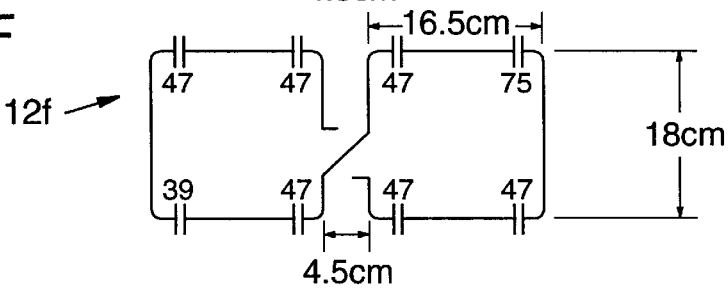

FIG. 4 illustrates the measured SNR of the volunteer's axial images obtained with the telescopic, extremity and body coils. The telescopic coil's SNR increased longitudinally from the thigh to the ankle region, improving visualization of distal run-off vessels. On average, the SNR increased by 140% when the telescopic coil was used. The SNR measurements on the phantom images were consistent with these results.

Use of the telescopic coil also decreased the exam time by 50%, as detailed in Table II. When the extremity and body coils were used, the former was positioned from the foot to the knee at four stations. Then it was removed and the body coil was used to image the thigh at an additional station. In contrast, the telescopic coil needed to be positioned just once on the patient at the beginning of the exam and imaging was complete after three stations. Although the phased array's image reconstruction took longer to process than the other coils, the exam times were unaffected because all of the localizers were obtained at the beginning of the exam. Therefore, after the first MRA scan, subsequent prescriptions and scanning proceeded while images reconstructed in the background.

TABLE II

| Task | Telescopic Coil | Extremity/Body Coil |
| --- | --- | --- |
| Patient Positioning | 3:59 (one position) | 19:03 (5 positions) |
| Scanning | 18:02 (3 stations) | 31:07 (5 stations) |
| Sequence Prescription/ Scanner Tuning | 18:10 | 32:38 |
| Total Examination | 40:11 | 82:48 |

Additional testing using three-dimensional time of flight generally confirmed the foregoing findings.

Additional experimental data, including exemplary imagery, can be found in our publications Kojima et al, "Lower Extremities: MR Angiography With a Unilateral Telescopic Phased-Array Coil," Radiology, 196(3): 871–875 (1995), and Szumowski et al, "A Telescopic Phased Array Coil for MRA of the Lower Extremities," Proc. of the Soc. of Magn. Reson., Nice, France, August, 1995.

Discussion

The illustrated coil array provides high SNR over large regions, without sacrificing resolution of increasing scan time. This makes it ideal for MRA of long vascular segments. In two-dimensional time of flight, the small slower-flowing distal vessels require higher SNR because the signal intensity is dependent on both the voxel size and velocity of the blood. The relatively small coils of the illustrated array provide this necessary SNR. Moreover, the use of non-planar coils provides greater depth sensitivity.

Another design consideration which contributes to the illustrated embodiment's suitability for such imaging includes its use of tuning capacitors at multiple locations along the coils to minimize shifting of the resonance frequency when different sized patients load the coil. Coil unit 12a has 13 capacitors, unit 12b has 10, unit 12c has 9, unit 12d has 7, unit 12e has 6, and unit 12f has 8, for a total of 48. This averages to eight capacitors per coil. An average in excess of five is believed desirable; six is better; seven is better than six. More than eight is better still.

Another design consideration is the ratio between the aggregate length of the coils and the volume being imaged. The illustrated embodiment includes approximately 900 cm. of foil tape conductor, dedicated to imaging a volume (the inside of the coil array) of approximately 20,000 cm$^3$ (a volume to length ratio of 22:1). Desirably, there is a ratio of not more than 30 cm$^3$ of imaged volume per 1 cm. of conductor; better results may be obtained with ratios of 20:1, 15:1, etc. (The foregoing is in the context of a whole-extremity coil array.)

A body coil is used for excitation in the preferred embodiment due to its relatively homogeneous RF field.

The foregoing factors all contribute to the cited 140% increase in SNR, and permit high resolution MRA from the inguinal ligament to the hindfoot.

Conclusion

Having described and illustrated the features of our invention with reference to an embodiment and several variations thereof, it will be apparent that the embodiment shown can be modified in arrangement and detail without departing from the principles of the invention.

For example, although the invention has been illustrated in the context of a coil array adapted for use with a single leg, the array can likewise be adapted for use with two legs. This can be done by replicating a single leg structure, or reshaping the structure to accommodate two legs.

Similarly, although the invention has been illustrated with reference to an assembly employing sections of rigid plastic pipe as the coil substrates, other coil substrates can of course be used. One such alternative is sheets of flexible plastic. In such an embodiment, the sheets of plastic are wrapped about the patient's leg, joined by Velcro or the like. Embodiments employing hybrid arrangements can also be employed, e.g. with a bottom half of the coil formed on a rigid substrate, and the top half of the coil formed on a flexible sheet to wrap over the top of the patient's leg.

All of the foregoing embodiments are characterized by coils that extend both above, below, and along both sides, of the patient's leg. In other embodiments, coils spanning less than all sides of the leg can be employed if—for example—high SNR imaging of all of the leg is not required.

The illustrated embodiments employ six component coil units, but this number is not essential. A greater or lesser number can be employed, depending on the application being served. Moreover, the invention is not limited to coil arrays for use with the legs. It will be obvious to one skilled in the art to modify the number, size, and configuration of the coils to encompass another extremity, such as the arm, or head, or neck.

While the illustrated embodiment uses a hinge arrangement to couple two halves together, other arrangements can be used. For example, a top part of the substrate can be arranged to fully detach from the lower, with electrical connectors being provided to interconnect the coil halves on the two parts as necessary. In still other arrangements, a closed substrate can be employed, and it can be placed around the extremity to be imaged simply by sliding it therealong. (This latter arrangement is generally disfavored because passage of the foot down through such a substrate requires a larger bore than would otherwise be necessary, impairing SNR. Moreover, it limits the size of extremity that can be accommodated. The illustrated arrangement, in contrast, can accommodate oversized extremities simply by leaving the latches unlatched; the resulting imagery does not suffer thereby.)

The variant features described above can each be combined with each other. For brevity's sake, however, such permutations and combinations are not each individually detailed herein.

In addition to such variations of the coil array's physical structure, its method of use can also be varied. For example, in some applications it is desirable to use less than all six coils at a time. Activating just two or three coils can further improve SNR because, for a given segment, the farthest coil contributes relatively little intravascular signal to the composite image. Decreasing the number of activated coils also reduces the reconstruction processing time.

In view of the wide variety of embodiments to which the principles of our invention can be applied, it should be understood that the detailed embodiments are illustrative only and should not be taken as limiting the scope of our invention. Rather, we claim as our invention all such embodiments as may come within the scope and spirit of the following claims, and equivalents thereto.

We claim:

1. A coil assembly for acquiring magnetic resonance signals from a single extremity of a patient, comprising at least three non-planar coils, each defining an opening for receiving said single extremity, said first, second and third coils having openings of first, second and third dimensions, respectively, the first dimension being greater than the second, the second dimension being greater than the third, the coils being disposed in a telescopic arrangement, wherein each of the first, second, and third coils surround said single extremity.

2. The coil assembly of claim 1 wherein the first coil partially overlaps the second, and the second coil partially overlaps the third.

3. The coil assembly of claim 1 comprising N non-planar coils, where N is at least four, wherein the opening defined by one of said coils is smaller than that defined by two coils adjacent thereto, said adjacent coils both overlapping said smaller coil.

4. The coil assembly of claim 1 including a hinge arrangement on a side of the assembly for opening said assembly to receive the patient's single extremity therein, said coil assembly also including a coupling on a side thereof opposite the hinge arrangement to secure the coil assembly in a closed position around the single extremity for use, said first, second and third coils surround the single extremity when the coil assembly is in the closed position.

5. The coil assembly of claim 1 comprising first and second parts which detach from one another to receive the patient's extremity therein.

6. The coil assembly of claim 1 in which the coils each includes capacitors at a plurality of locations therearound to mitigate detuning of the coils in the presence of different patient loading, there being an average of more than five capacitors per coil.

7. The coil assembly of claim 6 in which there is an average of at least seven capacitors per coil.

* * * * *